United States Patent
Gruhlke et al.

(10) Patent No.: US 7,173,686 B2
(45) Date of Patent: Feb. 6, 2007

(54) OFFNER IMAGING SYSTEM WITH REDUCED-DIAMETER REFLECTORS

(75) Inventors: Russell W. Gruhlke, Fort Collins, CO (US); Rene P. Helbing, Palo Alto, CA (US)

(73) Assignee: Agilent Technologies, Inc.

( * ) Notice: Subject to any disclaimer, the term of this patent is extended or adjusted under 35 U.S.C. 154(b) by 93 days.

(21) Appl. No.: 10/933,170

(22) Filed: Sep. 2, 2004

(65) Prior Publication Data

US 2006/0044535 A1    Mar. 2, 2006

(51) Int. Cl.
*G03B 27/42* (2006.01)
(52) U.S. Cl. ............................ 355/53; 355/67; 355/71; 378/34; 378/35; 250/492.1
(58) Field of Classification Search ............... None
See application file for complete search history.

(56) References Cited

U.S. PATENT DOCUMENTS 3,748,015 A    7/1973   Offner 5,512,759 A *  4/1996   Sweatt ................. 250/492.1
5,537,385 A *  7/1996   Alon et al. ............. 369/112.29
2003/0007066 A1   1/2003   Forrer et al.
2004/0218162 A1* 11/2004  Whitney ................ 355/54

FOREIGN PATENT DOCUMENTS

GB       2 332 533       6/1999
WO       WO 92/02838     2/1992

* cited by examiner

*Primary Examiner*—D. Rutledge

(57) ABSTRACT

A projection optical system for digital lithography includes an Offner imaging system with a defined optical axis. The Offner imaging system has a well-corrected region. The system includes means for shaping an optical beam having an extent too large to fit within the well-corrected region to propagate through the Offner imaging system within the well-corrected region.

21 Claims, 13 Drawing Sheets

OFFNER IMAGING SYSTEM WITH REDUCED-DIAMETER REFLECTORS

BACKGROUND OF THE INVENTION

Lithographic imaging systems are high precision, high cost optical systems. As the critical dimensions of the lithographic systems are decreasing, the imaging systems are subject to pressure to improve the accuracy of the images they form. Some lithographic imaging systems employ image correction to reduce errors in images they form. However, lithographic imaging systems with image correction are complex and difficult to align and to maintain in alignment. These complex systems are often subject to misalignment due to environmental thermal changes so that the imaging equipment must be maintained in a thermally stable environment.

FIG. 1 is a cross-sectional schematic side view of an Offner imaging system used in present day lithographic systems. The Offner imaging system 10 is a concentric imaging system having a primary mirror 12 and a secondary mirror 14. The primary mirror 12 has a concave spherical surface 13. The secondary mirror 14 has a convex spherical surface 15. The radius of curvature of the convex spherical surface 15 is about half the radius of curvature of the concave spherical surface 13. The convex spherical surface 15 and the concave spherical surface 13 have centers of curvatures positioned at about the same point 17 indicated by an X on the optical axis 16 shared by the primary mirror 12 and the secondary mirror 14. The Offner imaging system 10 has an object plane 26 and an image plane 27.

In operation, an optical beam 21 propagating from object 18 located at the object plane 26 is directed towards primary mirror 12. Object 18 may be a spatial light modulator or other photolithographic reticle. The optical beam 21 is sequentially reflected by the concave spherical surface 13, the convex spherical surface 15 and the concave spherical surface 13. The second reflection by the concave spherical surface 13 directs the optical beam 21 out of the Offner imaging system 10. The Offner imaging system 10 forms a real inverted image 19 of an object 18 at an image plane 27 spatially removed from the object plane 26. A spatial light modulator located in the object plane 26 is imaged in a one-to-one dimensional relationship on a workpiece. The workpiece may be, for example, a wafer located at the image plane 27.

Reflection of the optical beam 21 by concave spherical surface 13 and convex spherical surface 15 produces no chromatic aberration. If the radius of curvature of the secondary mirror 14 is half that of the primary mirror 12, all $3^{rd}$ order Seidel aberrations such as spherical, astigmatism, coma, field curvature and distortion are zero in the image plane 27. However, higher order astigmatism is problematic. Increasing the radius of curvature of the secondary mirror 15 from the 2:1 ratio with the radius of curvature of primary mirror 12 introduces some $3^{rd}$ order astigmatism that cancels with the higher order astigmatism in a narrow annular region of the image plane 27. Any image formed within this annular region is well corrected. Unfortunately, the well-corrected region is a relatively small region of the image plane 27.

Some digital photolithography systems use a reticle that is dynamic, not fixed. In such systems, light is reflected at, transmitted through or emitted from a spatial light modulator located in the object plane 26. The spatial light modulator has a high aspect ratio. The aspect ratio of the spatial light modulator is the ratio of the length to the width of the spatial light modulator. A high aspect ratio is a ratio of more than 5:1. A typical spatial light modulator for a digital lithography system has dimensions of 75 mm to 1 mm for a 75:1 aspect ratio. To fit the complete image of the spatial light modulator within the well-corrected annular region of the image plane 27, requires that the diameter of the primary mirror 12 be large. For a 1 mm by 75 mm reticle image to be within the well-corrected annular region of the primary mirror 12, the diameter of the primary mirror would be about 651 mm. A concave mirror of this size is very expensive.

What is needed is a way to reduce the diameter of the primary mirror 12 in an optical imaging system for digital lithography capable of imaging a high aspect ratio reticle within the well-corrected region. This would reduce the cost of the primary mirror. Specifically, it is desirable to reduce the diameter of the primary mirror 12 to less than 200 mm, since fabrication costs increase rapidly for mirror diameters greater than 200 mm.

SUMMARY OF THE INVENTION

One aspect of the present invention provides a projection optical system for digital lithography, including an Offner imaging system. The Offner imaging system defines an optical axis and has a well-corrected region. The projection optical system includes means for shaping an optical beam having an extent too large to fit within the well-corrected region to propagate through the Offner imaging system within the well-corrected region.

Another aspect of the present invention provides a method of imaging a spatial light modulator. The method includes providing an Offner imaging system defining an optical axis and having a well-corrected region, emitting an optical beam from the spatial light modulator, in which the optical beam has an extent too large to fit within the well-corrected region and shaping the optical beam to propagate through the Offner imaging system within the well-corrected region.

Another aspect of the present invention provides a projection optical system for digital lithography. The system includes an Offner imaging system, which defines an optical axis and has a well-corrected region. The system also includes a mirror system, concentric with the optical axis, operable to shape an optical beam having an extent too large to fit within the well-corrected region to propagate through the Offner imaging system within the well-corrected region.

DETAILED DESCRIPTION

Figure 1:
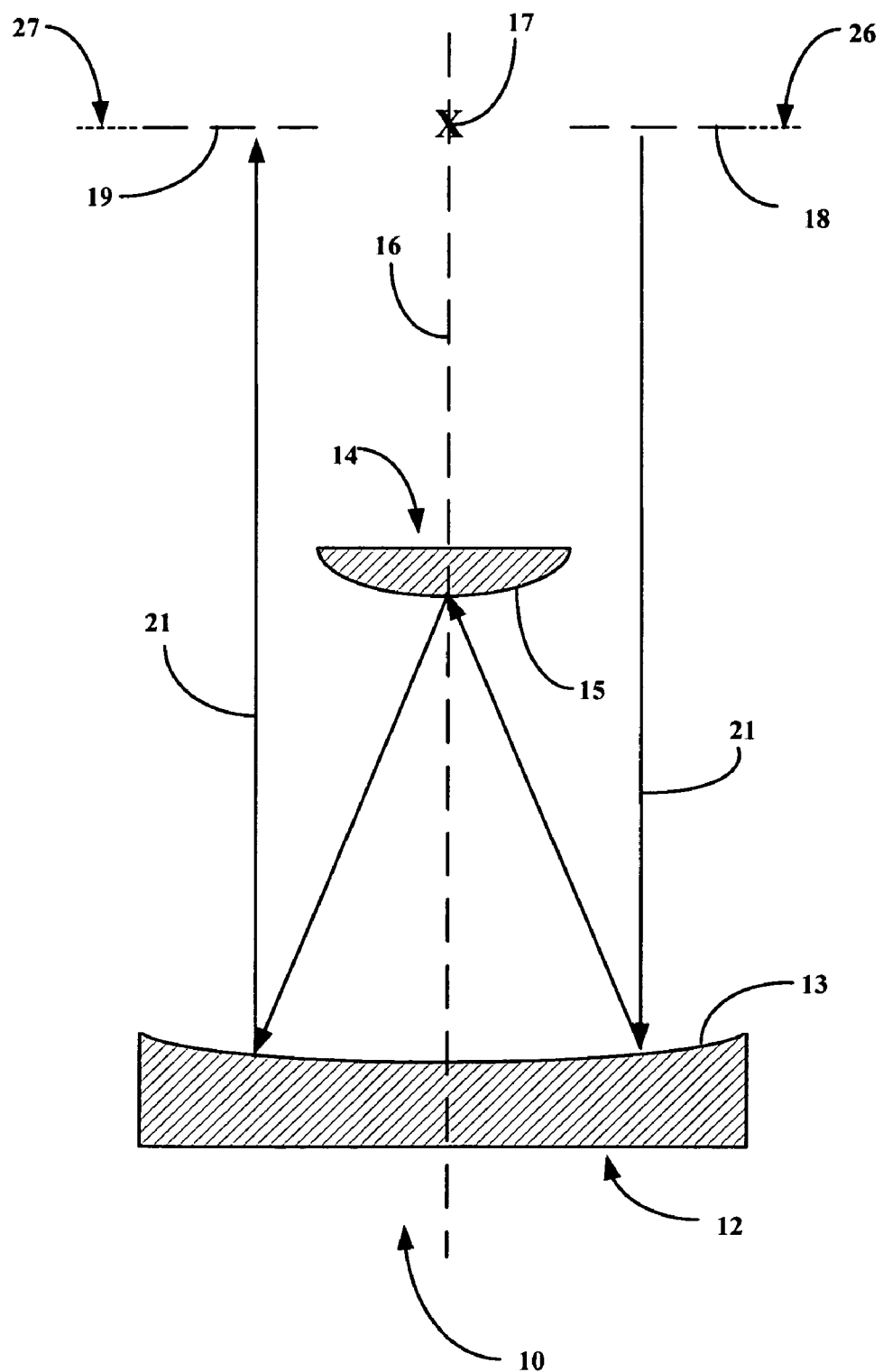
FIG. 1 is a cross-sectional view of an example of a conventional Offner imaging system.
Figure 2:
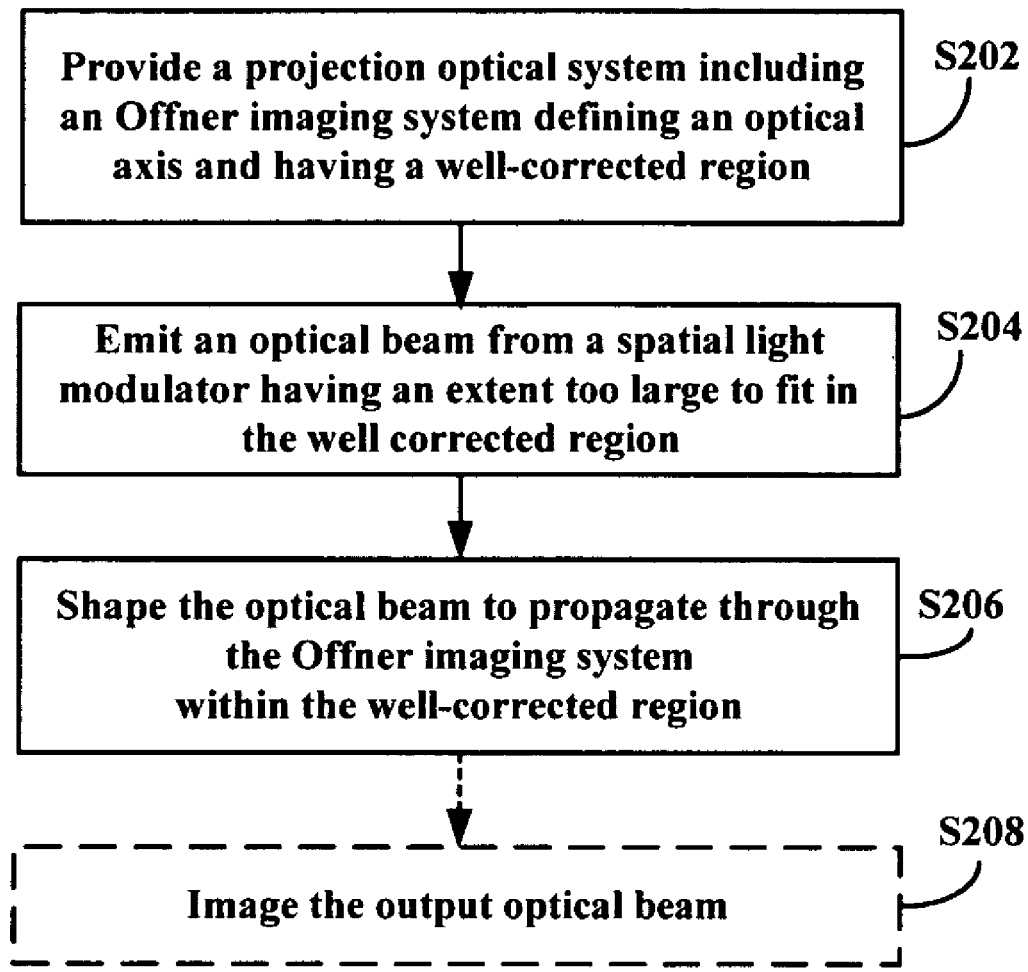
FIG. 2 is a flow chart illustrating a method of imaging a spatial light modulator in accordance with the invention.

FIG. 2 is a flow chart 200 illustrating a method of imaging a spatial light modulator in accordance with the invention. During stage S202, a projection optical system including an Offner imaging system 10 is provided. The Offner imaging system 10 defines an optical axis 16 and has a well-corrected region as described above with reference to FIG. 1.

During stage S204, an optical beam is emitted from a spatial light modulator. The extent of the emitted optical beam is too large to fit within the well-corrected region of Offner imaging system 10.

During stage S206, the optical beam is shaped to propagate through the Offner imaging system 10 within the well-corrected region.

Stage S208 is optional. During stage S208, the output optical beam is imaged in the image plane of the projection optical system. In one embodiment, the imaging includes focusing the output optical beam in the image plane.

Figure 3:
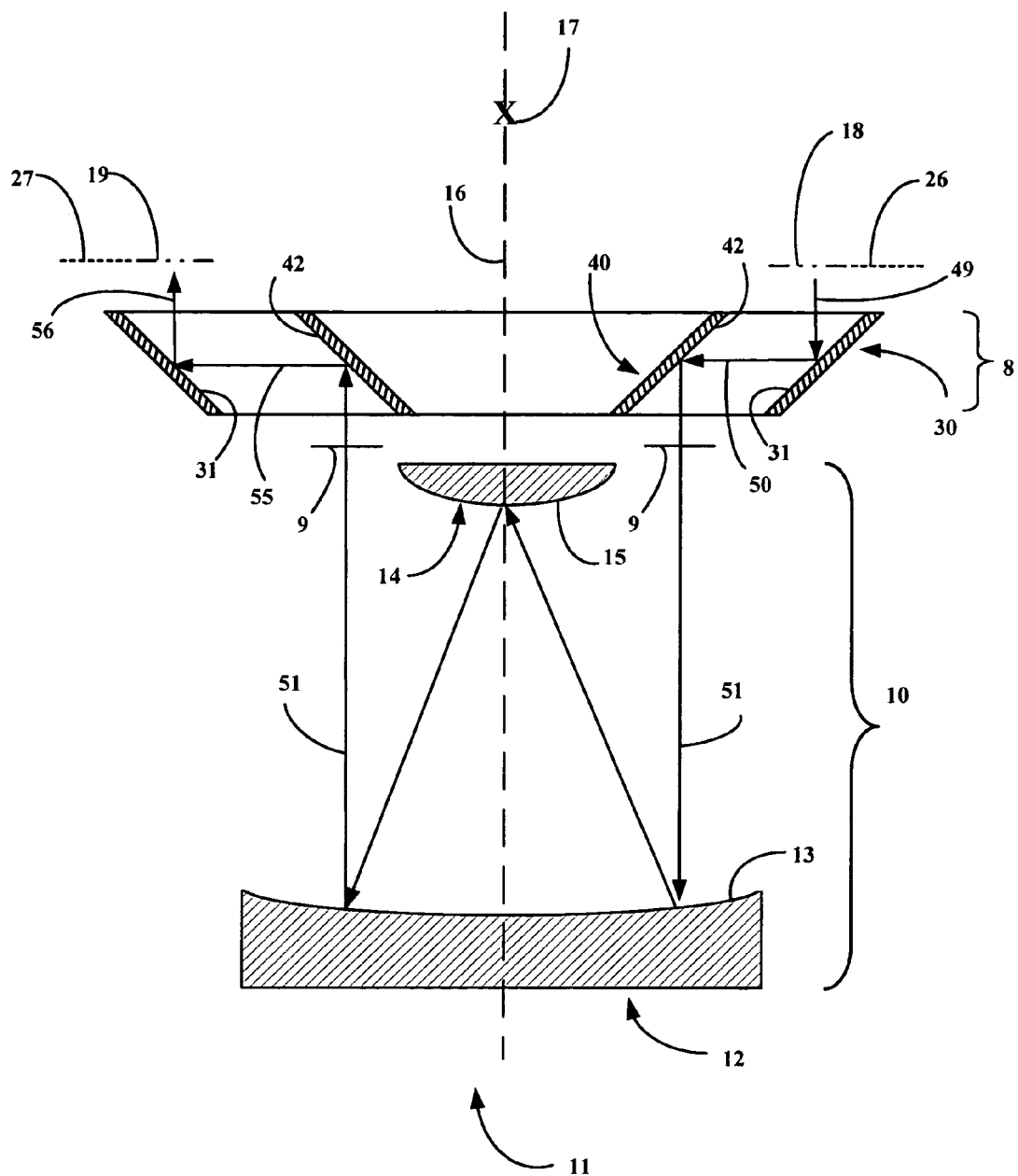
FIG. 3 is a cross-sectional view of an example of a first embodiment of a projection optical system for digital lithography in accordance with the invention.
Figure 4:
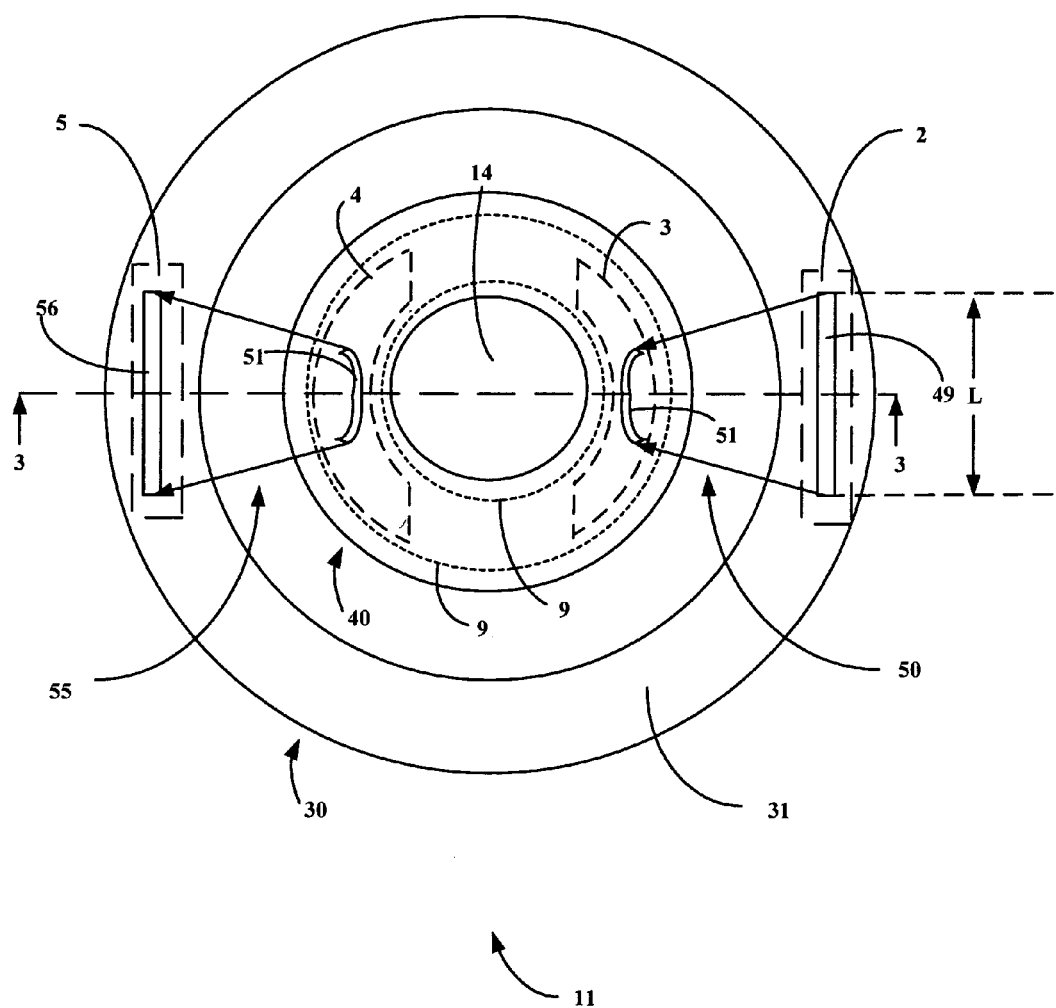
FIG. 4 is a top view of the example of the first embodiment of the projection optical system for digital lithography of FIG. 3.

FIGS. 3 and 4 are, respectively, a cross-sectional view and a top view of an example of a first embodiment of a projection optical system 11 for digital lithography in accordance with the invention. The plane upon which the cross-section view of FIG. 3 is taken is indicated by section line 3—3 in FIG. 4. In FIGS. 3 and 4, like elements share like reference numbers with each other and with FIG. 1.

Projection optical system 11 is a concentric imaging system composed of the Offner imaging system 10 and a mirror system 8 (FIG. 3). The Offner imaging system 10, as described above with reference to FIG. 1, includes a primary mirror 12 and a secondary mirror 14. The mirror system 8 is composed of an outer frustoconical reflector 30 having a frustoconical internal reflective surface 31 and an inner frustoconical reflector 40 having a frustoconical external reflective surface 42.

Rays that strike the center of the secondary mirror 14 are called chief or principal rays for the Offner imaging system 10. These principal rays propagate parallel to the optical axis 16 when entering or exiting the Offner imaging system 10. Each principal ray is the central ray of a bundle of rays propagating from the object plane 26 towards the image plane 27. Since the chief rays propagate parallel the optical axis 16, the region of the image side of the projection optical system 11 through which the principal rays propagate is within the well-corrected image region of Offner imaging system 10, as described above with reference to FIG. 1. Thus, the image 19 in the image plane 27 is in the well-corrected region. Likewise, the region of the object side of the projection optical system 11 from which principal rays propagate is within the well-corrected object region of Offner imaging system 10 if the object 18 is located in the object plane 26.

The optical path indicated by the principal rays, which propagate from the well-corrected object region to the well-corrected image region, is within the well-corrected region of the projection optical system 11. The well-corrected region has an annular shape for the optical path segment that is parallel to the optical axis 16 and between mirror system 8 and the primary mirror 12. The annular shaped region of the optical path segment that is parallel to the optical axis 16 and between the primary mirror 12 and the various mirror systems of FIGS. 3–12 is called the well-corrected region 9.

The extent of the well-corrected region 9 is shown as plane sections in the cross-sectional views of FIGS. 3, 5, 7, 10 and 12. The extent of the well-corrected region 9 is shown as an annulus in the top views of FIGS. 4, 6, 8, 9 and 11. The optical paths indicated by the principal rays of the projection optical systems 11, 12, 13, 112, 113 and 114 of FIGS. 3–12 are within the well-corrected region 9.

The frustoconical internal reflective surface 31 faces the optical axis 16, is concentric with the optical axis 16 and is further from the optical axis 16 than the well-corrected region 9. The frustoconical external reflective surface 42 faces away from the optical axis and is concentric with the optical axis 16. The frustoconical external reflective surface 42 is aligned to direct light reflected by the frustoconical internal reflective surface 31 through the well-corrected region 9.

Mirror system 8 directs optical beam 49 from object plane 26 to the primary mirror 12. Mirror system 8 additionally directs the optical beam 56 from the Offner imaging system 10 to form a real image 19 of object 18 at an image plane 27 spatially removed from the object plane 26.

Optical beam 49 is reflected at a first portion 2 (FIG. 4) of frustoconical internal reflective surface 31 towards frustoconical external reflective surface 42 as optical beam 50. The first portion 2 of frustoconical internal reflective surface 31 subtends an angle of less than 180° at the optical axis 16.

The reflection of optical beam 49 at a first portion 2 (FIG. 4) of frustoconical internal reflective surface 31 performs the shaping of optical beam 49, which has an extent too large to fit within the well-corrected region 9, so that optical beam 49 propagates through the Offner imaging system 10 within the well-corrected region 9. The shaping includes reducing a dimension of the optical beam 50 reflected from frustoconical internal reflective surface 31.

Specifically, reflecting optical beam 49 at a frustoconical internal reflective surface 31 reduces the length L of optical beam 50. The optical beam 50 converges as it propagates from frustoconical internal reflective surface 31 to frustoconical external reflective surface 42. The length of the optical beam 50 decreases as it propagates so that optical beam 50 has a length of less than L when it is incident on frustoconical external reflective surface 42. The width of optical beam 50 remains constant as it propagates from frustoconical internal reflective surface 31 towards frustoconical external reflective surface 42.

Optical beam 50 is reflected at a first portion 3 (FIG. 4) of frustoconical external reflective surface 42 into the Offner imaging system 10 as optical beam 51. First portion 3 of frustoconical external reflective surface 42 subtends an angle of less than 180° at the optical axis 16.

The mirror system 8 directs the optical beam 51 through the well-corrected region 9. The optical beam 51 is reflected by the primary mirror 12, the secondary mirror 14 and again by primary mirror 12 of Offner imaging system 10 and emerges from Offner imaging system 10 as optical beam 51. The optical beam 51 is incident on a second portion 4 (FIG. 4) of frustoconical external reflective surface 42. Second portion 4 is diametrically opposite first portion 3 and subtends an angle of less than 180° at the optical axis 16. The term "opposite" as used herein encompasses a range of opposing positions, so the first portion 3 need not be exactly opposite the second portion 4.

Frustoconical external reflective surface 42 reflects optical beam 51 towards a second portion 5 (FIG. 4) of frustoconical internal reflective surface 31 as optical beam 55. Second portion 5 of frustoconical internal reflective surface 31 is diametrically opposite first portion 2 of frustoconical internal reflective surface 31. Second portion 5 subtends an angle of less than 180° at the optical axis 16.

Frustoconical internal reflective surface 31 reflects optical beam 55 towards image plane 27 as optical beam 56. Optical beam 56 forms a real inverted image 19 of object 18 at image plane 27.

In FIG. 4, an optical beam is represented by the extreme rays of the optical beam, which will be understandable from the context of the figure and the description. The extent of the annular well-corrected region 9 of Offner imaging system 10 located in the plane between the inner frustoconical reflector 40 and the primary mirror 12 is represented by broken lines 9. Broken lines 3 and 4 represent the extents of first portion 3 and second portion 4 projected onto the well-corrected region 9 of the Offner imaging system. The projected extents of first portion 3 and second portion 4 fit within the extent of the well-corrected region 9 of the Offner imaging system 10. Thus, as optical beam 51 propagates through the Offner imaging system 10, it fits within the well-corrected region 9 of the Offner imaging system 10 even though optical beam 49 has an extent too large to fit within the well-corrected region 9.

In one embodiment, the optical beam 49 is incident on frustoconical internal reflective surface 31 with a 45° angle of incidence, optical beam 50 is incident on frustoconical external reflective surface 42 with a 45° angle of incidence, optical beam 51 is incident on frustoconical external reflective surface 42 with a 45° angle of incidence, and optical beam 55 is incident on frustoconical internal reflective surface 31 with a 45° angle of incidence.

Figure 5:
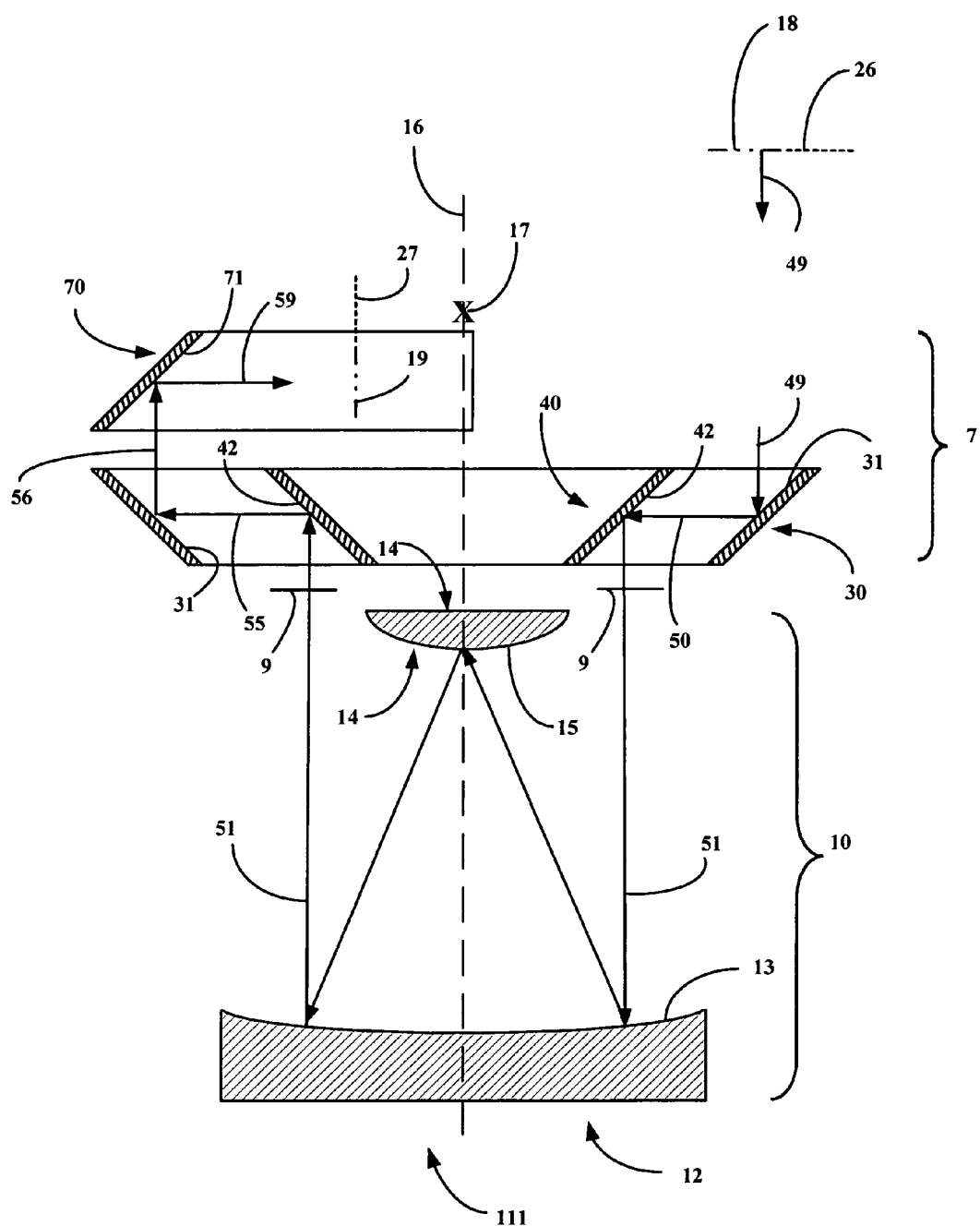
FIG. 5 is a cross-sectional view of an example of a second embodiment of a projection optical system for digital lithography in accordance with the invention.
Figure 6:
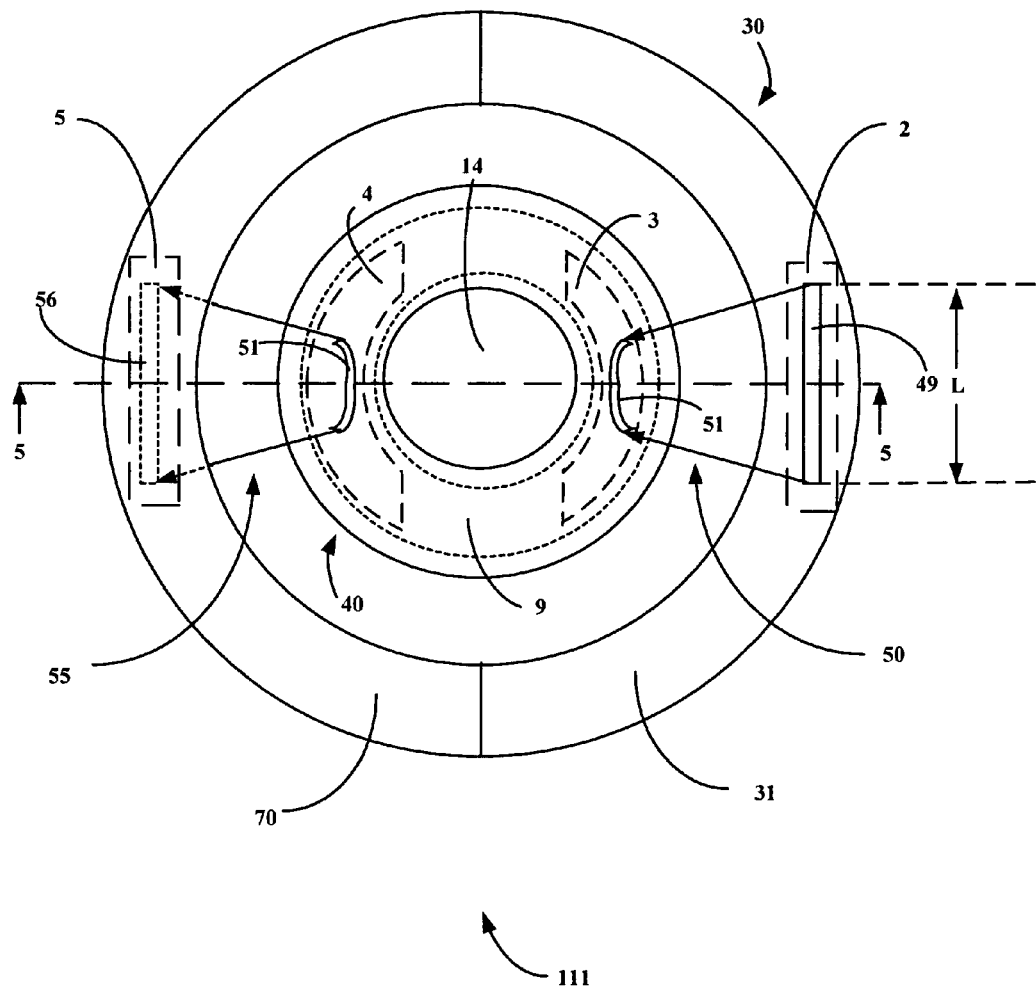
FIG. 6 is a top view of the example of the second embodiment of the projection optical system for digital lithography of FIG. 5.

FIGS. 5 and 6 are, respectively, a cross-sectional view and a top view of an example of a second embodiment of a projection optical system 111 for digital lithography in accordance with the invention. The plane upon which the cross-section view of FIG. 5 is taken is indicated by section line 5—5 in FIG. 6. In FIGS. 5 and 6, like elements share like reference numbers with each other and FIGS. 1, 3 and 4.

Projection optical system 111 for digital lithography is composed of an Offner imaging system 10 and a mirror system 7 (FIG. 5). Mirror system 7 provides a focusing capability that is not available in mirror system 8. A focusing capability is needed when the optical beam emitted from the object 18 in object plane 26 is diverging, rather than collimated. The projection optical system 111 focuses the optical beam 49 transmitted through projection optical system 111 to form a real inverted image 19 of object 18 at an image plane 27 spatially removed from the object plane 26.

The Offner imaging system 10, as described above with reference to FIG. 1, includes a primary mirror 12 and a secondary mirror 14. The mirror system 7 is composed of an outer frustoconical reflector 30 having a frustoconical internal reflective surface 31, an inner frustoconical reflector 40 having a frustoconical external reflective surface 42 and an upper semi-frustoconical reflector 70 having a semi-frustoconical internal reflective surface 71. The frustoconical internal reflective surface 31 and frustoconical external reflective surface 42 are located as described above with reference to FIGS. 2 and 3.

The semi-frustoconical internal reflective surface 71 focuses the optical beam 56 at an image plane 27 as output optical beam 59. The semi-frustoconical internal reflective surface 71 faces the optical axis 16, is further from the optical axis 16 than the well-corrected region 9 and is further from the primary mirror 12 than outer frustoconical reflector 30.

The operation of projection optical system 111 is similar to that of projection optical system 11. As described above with reference to FIGS. 3 and 4, the optical beam 49 is shaped to fit within the well-corrected region 9 upon propagation through the Offner imaging system 10. The optical beam 50 converges as it propagates from frustoconical internal reflective surface 31 to frustoconical external reflective surface 42. The length of the optical beam 50 decreases as it propagates so that optical beam 50 has a length of less than L when it is incident on frustoconical external reflective surface 42.

In projection optical system 111, optical beam 55 is reflected at frustoconical internal reflective surface 31 towards semi-frustoconical internal reflective surface 71 as optical beam 56. Then semi-frustoconical internal reflective surface 71 reflects optical beam 56 towards the workpiece in image plane 27 as optical beam 59. The curvature of semi-frustoconical internal reflective surface 71 provides the focusing capability of projection optical system 111. The optical beam 59 is focused to form a real inverted image 19 of object 18 at the image plane 27. In projection optical system 111, the image plane 27 is orthogonal to the object plane 26 and is typically located within the mirror system 7.

Figure 7:
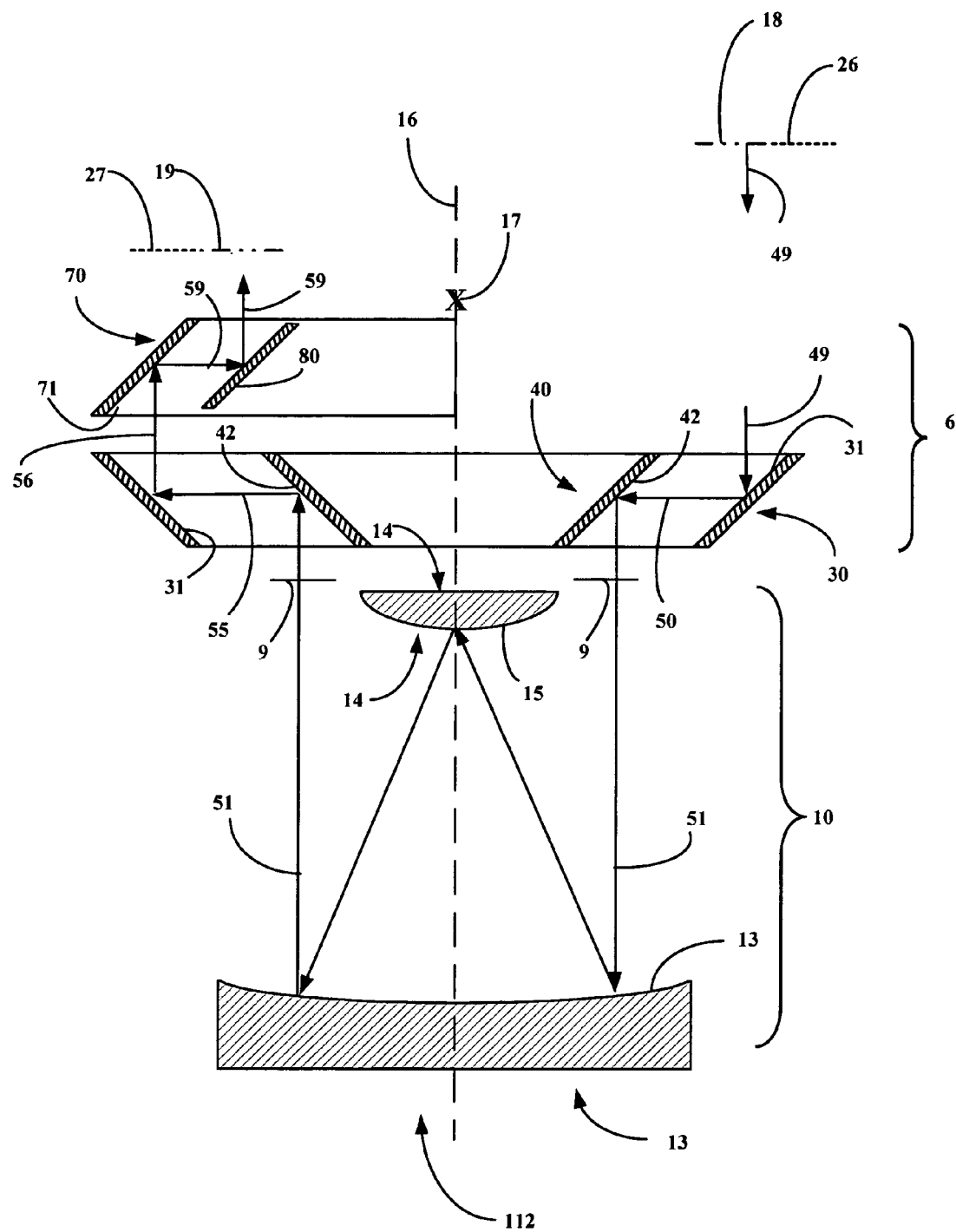
FIG. 7 is a cross-sectional view of an example of a third embodiment of a projection optical system for digital lithography in accordance with the invention.
Figure 8:
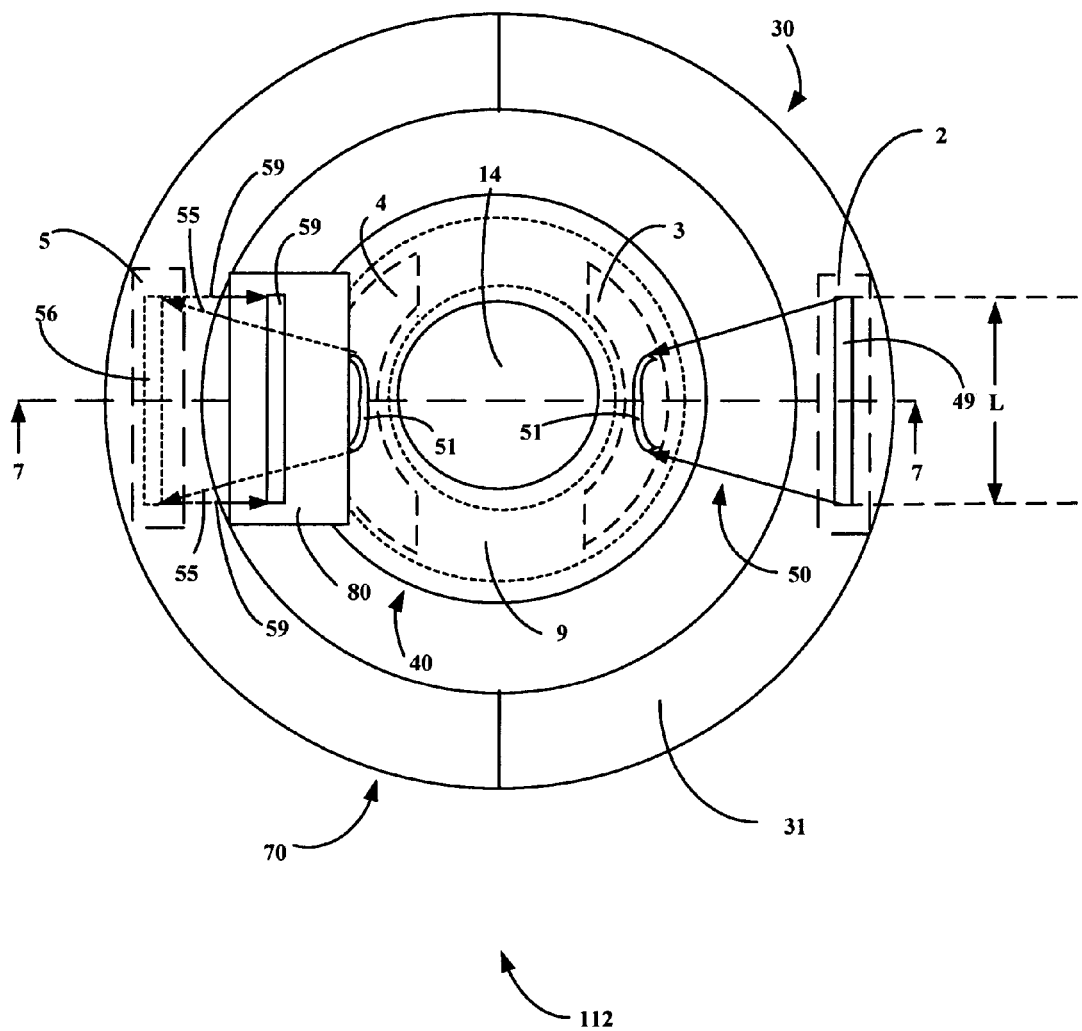
FIG. 8 is a top view of the example of the third embodiment of the projection optical system for digital lithography of FIG. 7.

FIGS. 7 and 8 are, respectively, a cross-sectional view and a top view of an example of a third embodiment of a projection optical system 112 for digital lithography in accordance with the invention. The plane upon which the cross-section view is taken is indicated by section line 7—7 in FIG. 8. In FIGS. 7 and 8, like elements share like reference numbers with each other and FIGS. 5 and 6.

Projection optical system 112 for digital lithography is composed of an Offner imaging system 10 and a mirror system 6. The mirror system 6 operates to focus the optical beam 59 in the image plane 27 and to direct optical beam 59 so that image plane 27 has a location external to the mirror system 6. Mirror system 6 is utilized in applications in which the workpiece on which the image 19 is focused is too large to fit within the mirror system 7.

The Offner imaging system 10, as described above with reference to FIG. 1, includes a primary mirror 12 and a secondary mirror 14. The mirror system 6 is composed of a plane mirror 80 and a mirror system similar to mirror system 7 of projection optical system 111. The mirror system 6 is composed of an outer frustoconical reflector 30, an inner frustoconical reflector 40, an upper semi-frustoconical reflector 70 and a plane mirror 80 positioned between semi-frustoconical internal reflective surface 71 and the image plane 27. Plane mirror 80 faces semi-frustoconical internal reflective surface 71.

Mirror 80 turns optical beam 59 to position the image plane 27 at a location external to the mirror system 6. In one embodiment, mirror 80 directs optical beam 59 to a location in which image plane 27 is parallel to the object plane 26 in projection optical system 112.

The operation of projection optical system 112 is similar to that of projection optical system 111. As described above with reference to FIGS. 3 and 4, the optical beam 49 is shaped to fit within the well-corrected region 9 upon propagation through the Offner imaging system 10. The optical beam 50 converges as it propagates from frustoconical internal reflective surface 31 to frustoconical external reflective surface 42. The length of the optical beam 50 decreases as it propagates so that optical beam 50 has a length of less than L when it is incident on frustoconical external reflective surface 42.

As described above with reference to FIGS. 5 and 6, optical beam 55 is reflected at frustoconical internal reflective surface 31 towards semi-frustoconical internal reflective surface 71 as optical beam 56. Semi-frustoconical internal reflective surface 71 reflects optical beam 56 towards the workpiece in image plane 27 as optical beam 59. The curvature of semi-frustoconical internal reflective surface 71 provides the focusing capability of projection optical system 112. Then semi-frustoconical internal reflective surface 71 reflects optical beam 59 towards plane mirror 80 and plane mirror 80 reflects optical beam 59 towards a workpiece located in image plane 27. The optical beam 59 is focused to form a real inverted image 19 of object 18 at the image plane 27.

Figure 9:
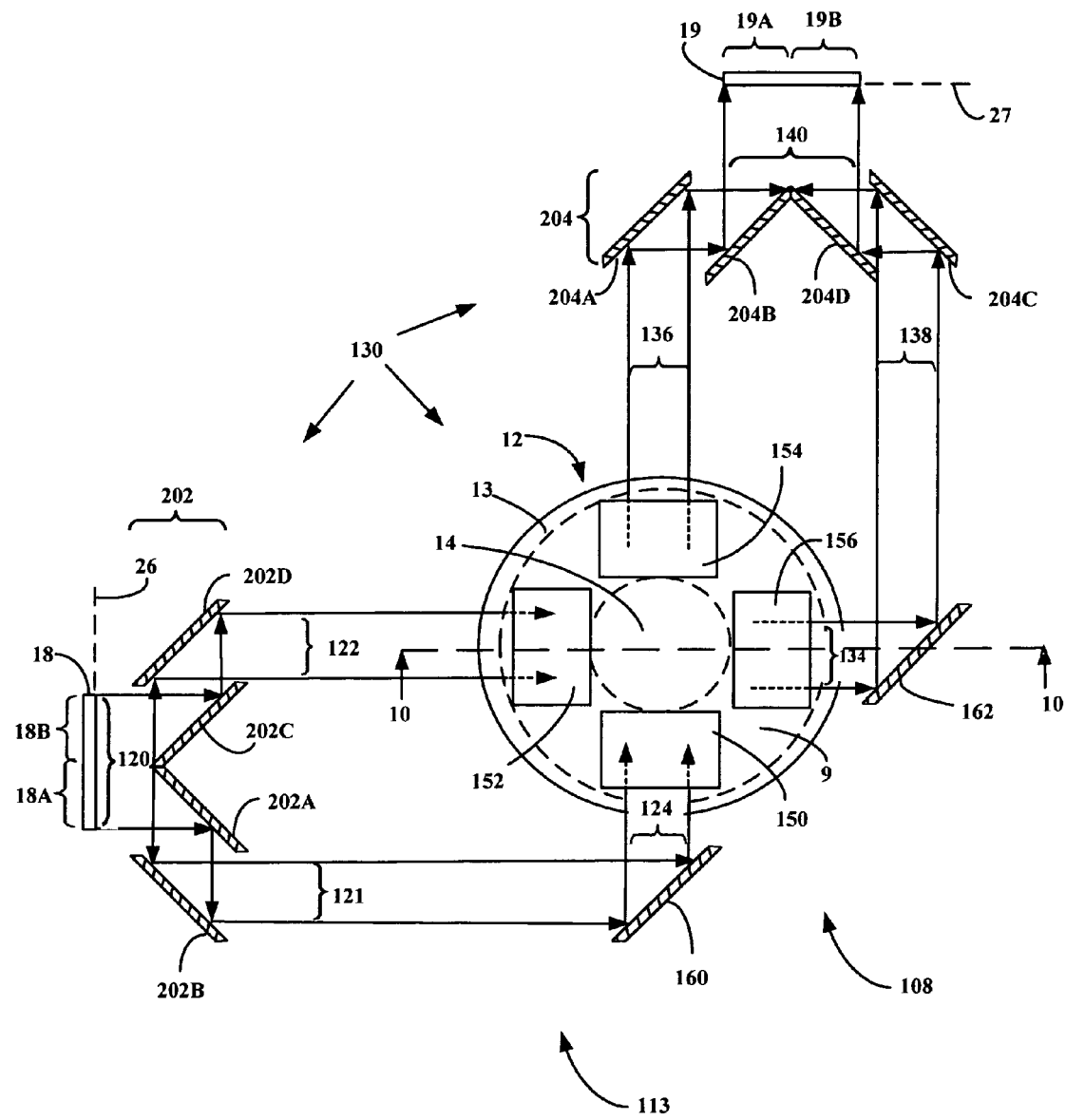
FIG. 9 is a top view of an example of a fourth embodiment of a projection optical system for digital lithography in accordance with the invention.
Figure 10:
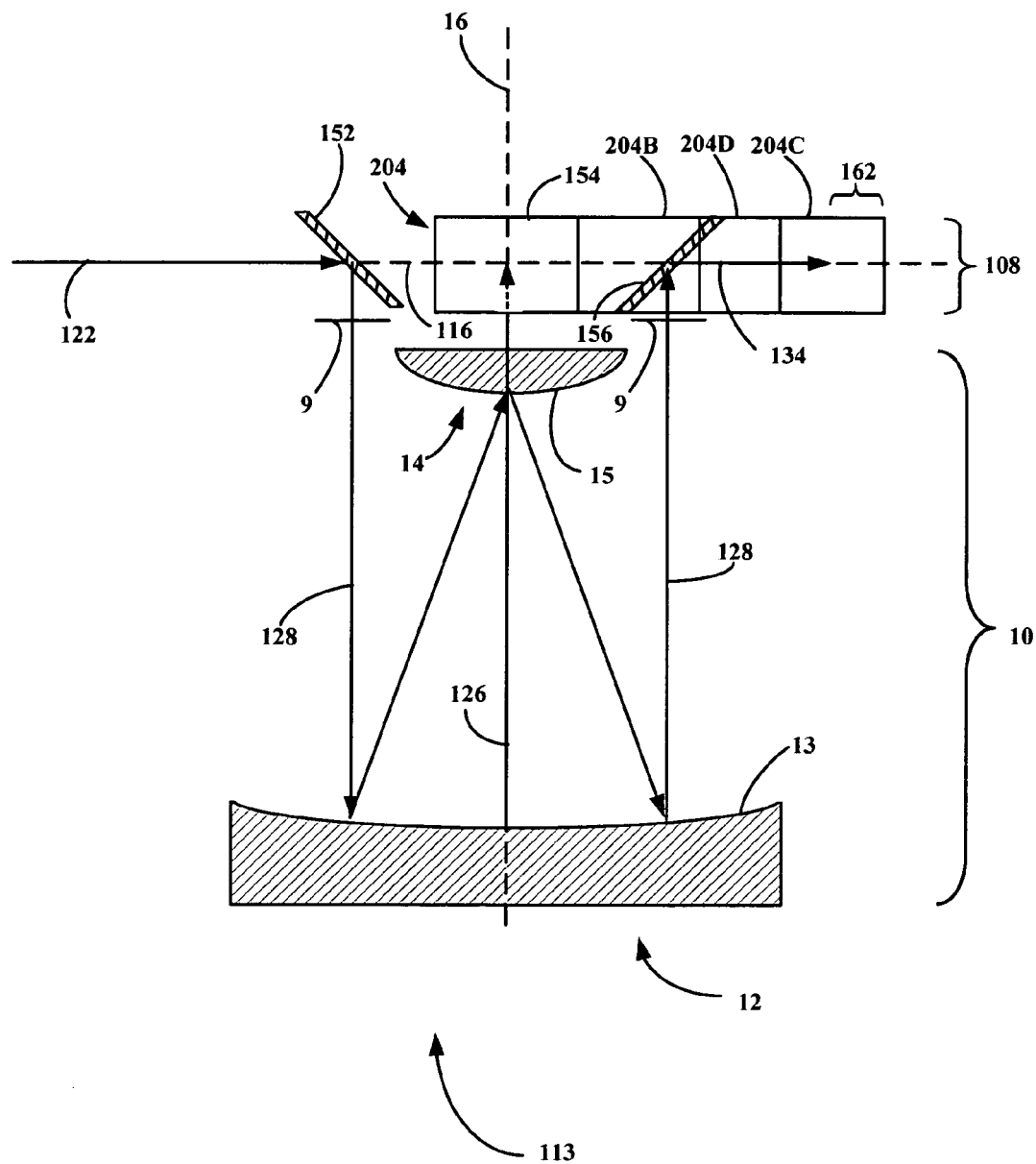
FIG. 10 is a cross-sectional view of the example of the fourth embodiment of the projection optical system for digital lithography of FIG. 9.

FIGS. 9 and 10 are, respectively, a top view and a cross-sectional view of an example of a fourth embodiment of a projection optical system 113 for digital lithography in accordance with the invention. The plane upon which the cross-section view of FIG. 10 is taken is indicated by section line 10—10 in FIG. 9. In FIGS. 9 and 10, like elements share like reference numbers with each other and FIG. 1.

Projection optical system 113 is composed of the Offner imaging system 10 and mirror system 130. Mirror system 130 is composed of mirror system 202, mirror system 204 and mirror system 108. The Offner imaging system 10, as described above with reference to FIG. 1, includes a primary mirror 12 and a secondary mirror 14.

The mirror system 202 includes plane mirrors 202A, 202B, 202C and 202D, which shape partially coherent optical beam 120 and direct two partially coherent optical beam segments 121 and 122 towards the mirror system 108. In one embodiment, the optical beam 120 is non-coherent.

Mirror system 108 includes plane turning mirrors 160 and 162 and plane folding mirrors 150, 152, 154 and 156. Plane folding mirrors 150, 152, 154 and 156 form a mirror system that is concentrically aligned with the optical axis 16. Plane folding mirrors 150, 152, 154 and 156 are positioned in a plane 116 (FIG. 10) perpendicular to the optical axis 16. Plane folding mirrors 150, 152, 154 and 156 are offset from the well-corrected region 9 and circumferentially aligned about the optical axis 16. Mirror system 108 direct partially coherent optical beam segments 121 and 122 to propagate through the Offner imaging system 10 within the well-corrected region 9 and to be output from Offner imaging system 10 as partially coherent optical beam segments 136 and 138, respectively.

Mirror system 204 includes plane mirrors 204A, 204B, 204C and 204D, which conjoin output optical beam segment 136 with output optical beam segment 138 to form a real inverted image 19 in the image plane 27.

Mirror system 202 performs the shaping of optical beam 120, which has an extent too large to fit within the well-corrected region 9, so that optical beam 120 propagates through the Offner imaging system 10 within the well-corrected region 9. The shaping includes segmenting the optical beam 120 into optical beam segments 121 and 122.

Object 18 located in the object plane 26 emits a partially coherent optical beam 120. In one embodiment, object 18 is a spatial light modulator and has a high aspect ratio. A first segment of optical beam 120 emitted from object segment 18A is incident on plane mirror 202A with an incidence angle of 45° and is reflected by plane mirror 202A towards plane mirror 202B as optical beam segment 121. The optical beam segment 121 is reflected by plane mirror 202B towards plane turning mirror 160. A second segment of optical beam 120 emitted from object segment 18B is incident on plane mirror 202C with an incidence angle of 45° and is reflected by plane mirror 202C towards plane mirror 202D as optical beam segment 122. The optical beam segment 122 is reflected by plane mirror 202D towards plane folding mirror 152. In one embodiment, the length of the object segments 18A and 18B are each about half of the length of object 18.

One edge of plane mirror 202A is parallel to and touching an edge of plane mirror 202C. The reflective faces of plane mirror 202A and 202C subtend an angle of 270° at the touching edges. In one embodiment, two adjacent faces of a mirrored cube form plane mirror 202A and 202C. Plane mirrors 202A and 202B are parallel. Plane mirrors 202C and 202D are parallel. The centers of plane mirrors 202B and 202D are laterally offset from each other by an amount about equal to the lateral offset between the centers of plane turning mirror 160 and plane folding mirror 152.

The optical beam segments 121 and 122 shaped by the mirror system 202 are directed by mirror system 108 to the well-corrected region 9 of Offner lens system 10.

Optical beam 121 is reflected at plane turning mirror 160 towards plane folding mirror 150 as optical beam 124. Plane folding mirror 150 and plane folding mirror 154 form a pair of folding mirrors 150/154 aligned with plane turning mirror 160. The optical beam 124 is reflected at plane folding mirror 150 into the Offner imaging system 10 as optical beam 126 (FIG. 10).

The plane folding mirror 150 directs the optical beam 126 through the well-corrected region 9. The optical beam 126 is reflected by the primary mirror 12, the secondary mirror 14 and again by primary mirror 12 of Offner imaging system 10 and emerges from Offner imaging system 10 as optical beam 126. The optical beam 126 is reflected at plane folding mirror 154 towards plane mirror 204A of mirror system 204 as optical beam segment 136.

The optical beam 122 is reflected at plane folding mirror 152 into the Offner imaging system 10 as optical beam 128 (FIG. 10). Plane folding mirror 152 and plane folding mirror 156 form a pair of folding mirrors 152/156 aligned with plane turning mirror 162. The plane folding mirror 152 directs the optical beam 128 through the well-corrected region 9. The optical beam 128 is reflected by the primary mirror 12, the secondary mirror 14 and again by primary mirror 12 of Offner imaging system 10 and emerges from Offner imaging system 10 as optical beam 128. The optical beam 128 is reflected at plane folding mirror 156 towards plane turning mirror 162 as optical beam 134. The optical beam 134 is reflected at plane turning mirror 162 towards plane mirror 204C in mirror system 204 as optical beam segment 138.

The optical beam segment 136 is incident on plane mirror 204A with an incidence angle of 45° and is reflected by plane mirror 204A towards plane mirror 204B. The optical beam segment 136 is reflected at plane mirror 204B towards image plane 27 as a first segment of output optical beam 140 to form image segment 19A in image plane 27. The optical beam segment 138 is reflected at plane mirror 204C towards plane mirror 204D. The optical beam segment 138 is reflected at plane mirror 204 D as a second segment of output optical beam 140 to form the image segment 19B in image plane 27 adjacent to image segment 19A.

The optical beam 140 is formed from the optical beam segments 136 and 138 reflected from planes mirrors 204B and 204D, respectively, and forms a real inverted image 19 in image plane 27. Image 19 consists of conjoined images 19A and 19B. In one embodiment, optical beam segment 136 and optical beam segment 138 are focused as image 19 at the image plane 27.

One edge of plane mirror 204B is parallel to and touching an edge of plane mirror 204D. The reflective faces of plane mirror 204B and 204D subtend an angle of 2700 at the touching edges. In one embodiment, two adjacent faces of a mirrored cube form plane mirror 204B and 204D. Plane mirrors 204A and 204B are parallel. Plane mirrors 204C and 204D are parallel. The centers of plane mirrors 204A and 204C are laterally offset from each other by an amount about equal to the lateral offset between the centers of plane folding mirror 154 and plane turning mirror 162.

By segmenting the optical beam 120 emitted from object 18 into two segments and transmitting the image of object segments 18A and 18B, as optical beams 121 and 122, respectively, optical beam 120 fits within the well-corrected region 9 of the Offner imaging system 10 even if unsegmented optical beam 120 does not fit within the well-corrected region 9. This allows the diameter of the primary mirror 12 to be reduced in size without causing aberration of the transmitted optical beam 140.

In one embodiment, the optical beam segment 121 is incident on turning mirror 160 with a 45° angle of incidence, optical beam segment 124 is incident on folding mirror 150 with a 45° angle of incidence, optical beam 126 is incident on folding mirror 154 with a 45° angle of incidence, optical beam segment 122 is incident on folding mirror 152 with a 45° angle of incidence, optical beam 128 is incident on folding mirror 156 with a 45° angle of incidence and optical beam segment 134 is incident on turning mirror 162 with a 45° angle of incidence. In this embodiment, the optical beams 128 and 126 propagate in the direction parallel to the optical axis 16 of Offner imaging system 10 before the first reflection at primary mirror 12 and after the second reflection at primary mirror 12.

Figure 11:
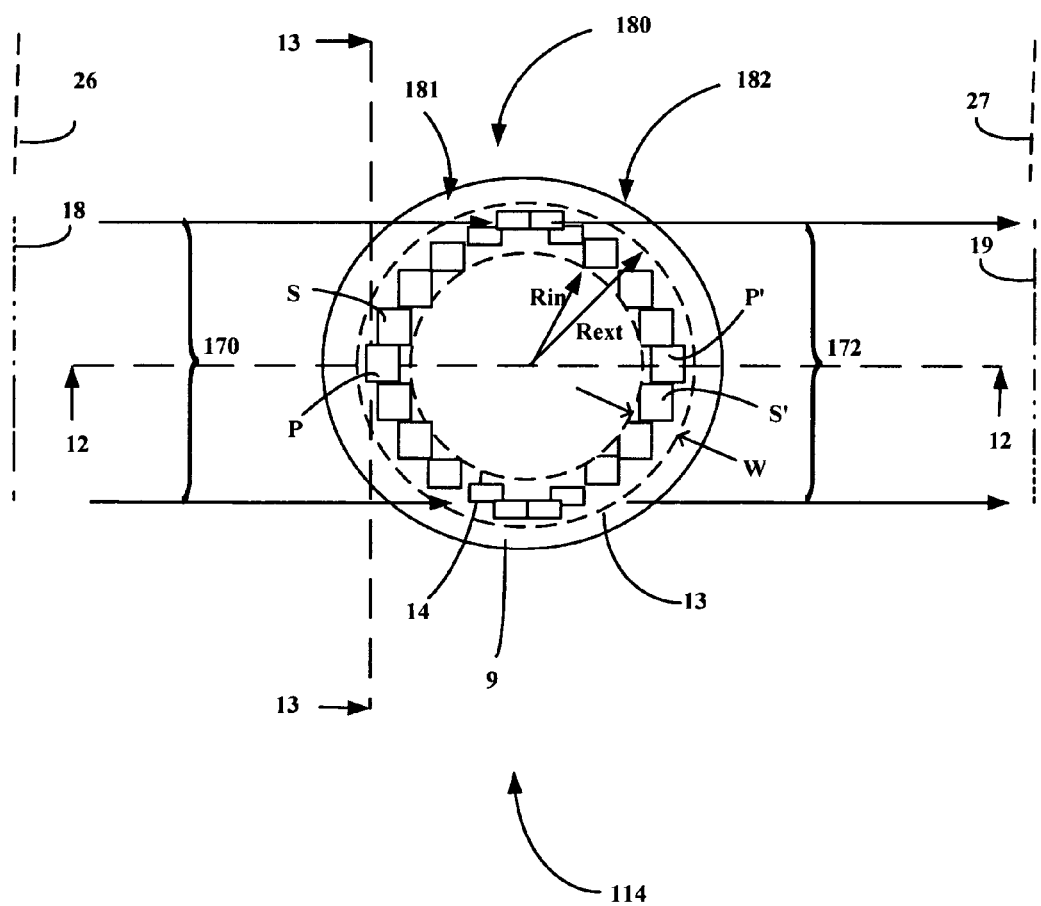
FIG. 11 is a top view of an example of a fifth embodiment of a projection optical system for digital lithography in accordance with the invention.
Figure 12:
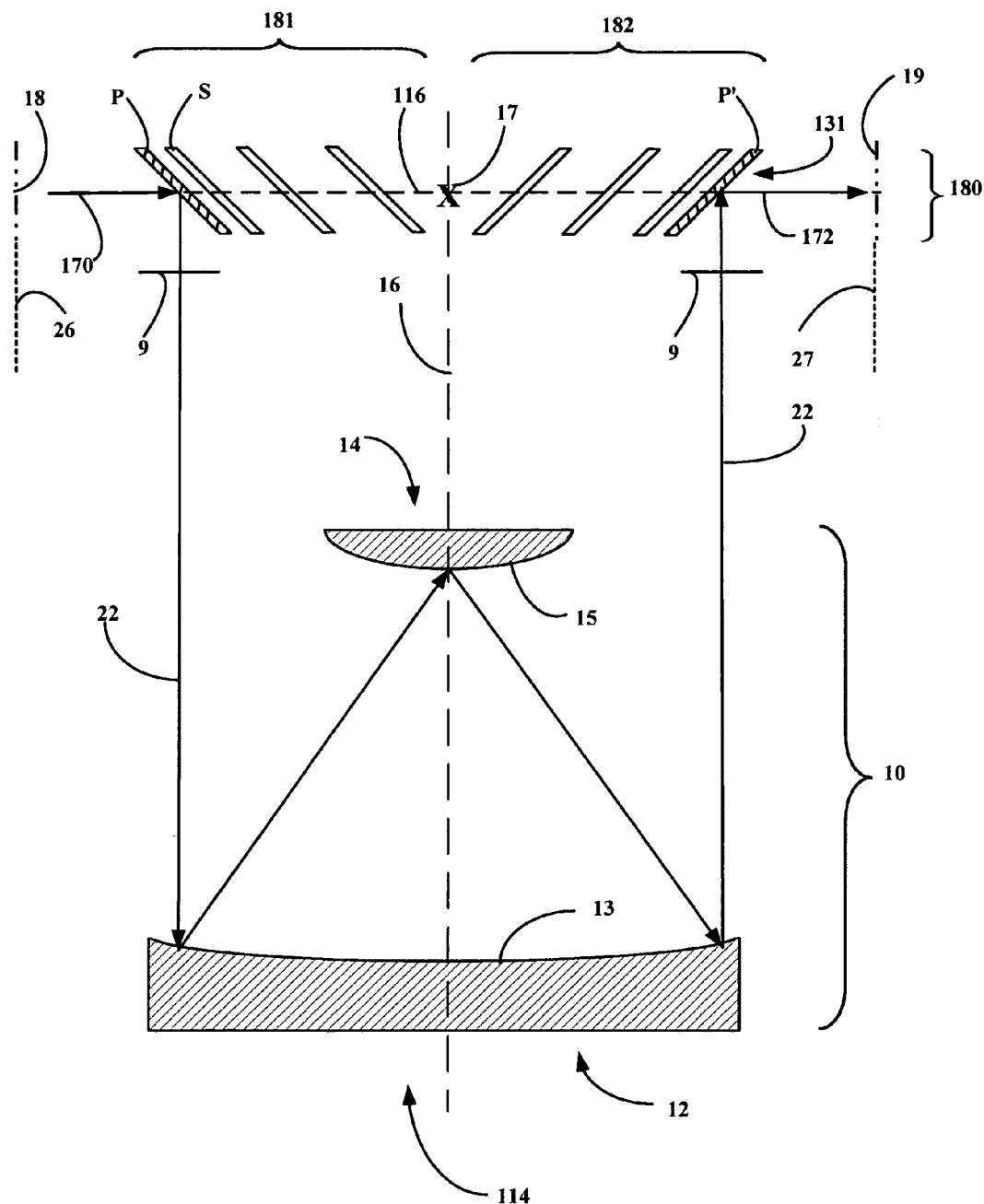
FIG. 12 is a cross-sectional view of the example of the fifth embodiment of the projection optical system for digital lithography of FIG. 11.
Figure 13:
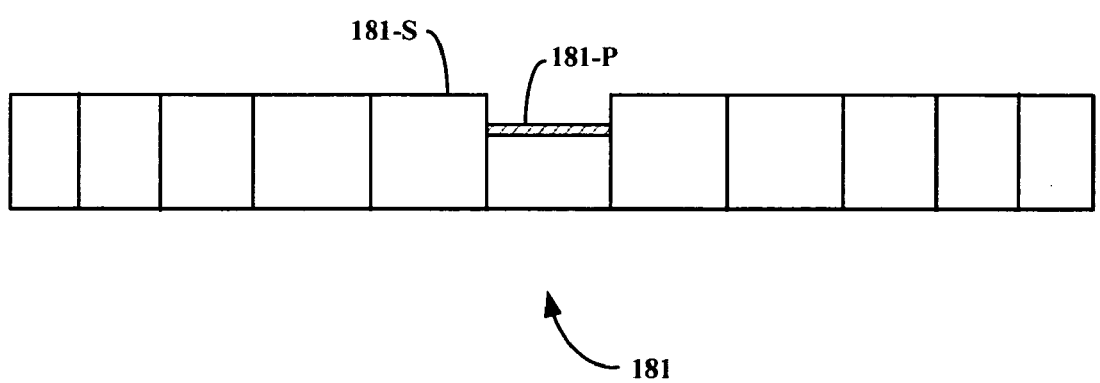
FIG. 13 shows a cross-sectional view representative of the first folding mirrors in the example of the fifth embodiment of the projection optical system for digital lithography of FIG. 11.

FIGS. 11 and 12 are, respectively, a top view and a cross-sectional view of an example of a fifth embodiment of a projection optical system 114 for digital lithography in accordance with the invention. The plane upon which the cross-section view of FIG. 12 is taken is indicated by section line 12—12 in FIG. 11. FIG. 12 shows a cross-sectional view of a representative portion of the folding mirror segments 180 in the projection optical system 114. FIG. 13 shows a cross-sectional view representative of the first folding mirrors 181 in the example of the fifth embodiment of the projection optical system 114 for digital lithography of FIG. 11. The plane upon which the cross-section view of FIG. 13 is taken is indicated by section line 13—13 in FIG. 11. In FIGS. 11–13 like elements share like reference numbers with each other and with FIG. 1.

Projection optical system 114 is composed of the Offner imaging system 10 and mirror system 131. Mirror system 131 is composed of mirror segments 180. The Offner imaging system 10, as described above with reference to FIG. 1, includes a primary mirror 12 and a secondary mirror 14.

Mirror system 131 composed of mirror segments 180 is concentric with the optical axis and that includes first folding mirrors 181 and second folding mirrors 182. First folding mirrors 181 perform the shaping of a partially coherent optical beam 170, which has an extent too large to fit within the well-corrected region 9, so that optical beam 170 propagates through the Offner imaging system 10 within the well-corrected region 9. The shaping includes segmenting the optical beam 170 into optical beam segments 22.

The mirror segments 180 are positioned in a plane 116 (FIG. 12) perpendicular to the optical axis 16 and offset along the optical axis 16 from the well-corrected region 9. The mirror segments 180 are circumferentially aligned about the optical axis 16. Each mirror segment 180 is aligned with the well-corrected region 9.

The first folding mirrors 181 all point in the same direction toward the object plane 26. The second folding mirrors 182 all point in the same direction toward image plane 27. There are equal numbers of first folding mirrors 181 and second folding mirrors 182. Diametrically opposite folding mirrors 181 and 182 form a pair of folding mirrors 181—182 to direct partially coherent or non-coherent optical beams segments 22 to and from the well-corrected region 9. The diametrically opposite folding mirrors 181 and 182 have the same width. The widths of mirror segments 180 and 182 are small enough to direct each optical beam segment 22 through the well-corrected region 9. A transcendental equation describes the geometrical relationship between the mirror segments 180 and the well-corrected region 9. The transcendental equation is a function of the width and length of each mirror segment 180, the internal radius, $R_{in}$, of the well-corrected region 9 annulus, external radius, $R_{ext}$, of the well-corrected region 9 annulus and the width of the well-corrected region, W, annulus. One skilled in the art can generate the transcendental equation.

Object 18 located in the object plane 26 emits a partially coherent optical beam 170. A high aspect ratio object 18, such as a spatial light modulator, located in the object plane 26 emits optical beam 170. The first folding mirrors 181 receive non-coherent or partially coherent optical beam 170. The optical beam 170 is segmented into optical beam segments 22 by reflection at the first folding mirrors 181. The first folding mirrors 181 are aligned to direct the optical beam segments 22 into the well-corrected region 9, thus, each optical beam segment 22 propagates through the well-corrected region 9 of Offner imaging system 10. The second folding mirrors 182 are aligned to direct optical beam segments 22 from the well-corrected region 9 of Offner imaging system 10 and to image the optical beam segments 22 reflected and conjoined at the second folding mirrors 182 as output optical beam 172.

An exemplary first folding mirror 181S, labeled S, is diametrically opposite an exemplary second folding mirror 182S', labeled S', to form a pair 181S/182S'. An exemplary first folding mirror 181P, labeled P, is diametrically opposite an exemplary second folding mirror 182P', labeled P,' to form a pair 181P/182P'. FIG. 12 shows the well-corrected region 9 aligned with the first folding mirror 181P from which an exemplary optical beam segment 22 is reflected.

The shaping of optical beam 170 and the directing of optical beam segments 21 are described below for two exemplary optical beam segments 22, which are segmented and directed by the diametrically opposite pairs 181S/182S' and 181P/182P'. The rest of the optical beam segments 22 are shaped and directed in like manner.

A segment of optical beam 170 is reflected at first folding mirror 181S towards the well-corrected region 9 of Offner imaging system 10 as first optical beam segment 22. The first optical beam segment 22 is reflected by the primary mirror 12, the secondary mirror 14 and again by primary mirror 12 of Offner imaging system 10 and emerges from Offner imaging system 10 as first optical beam segment 22. The second reflection by the concave spherical surface 13 directs the first optical beam segment 22 towards the second folding mirror 182S'. The first optical beam segment 22 is reflected at the second folding mirror 182S' towards image plane 27 of the projection optical system 114 as a portion of optical output beam 172.

A second optical beam segment 22 is reflected at first folding mirror 181P towards the well-corrected region 9 of Offner imaging system 10 as second optical beam segment 22. The second optical beam segment 22 is reflected by the primary mirror 12, the secondary mirror 14 and again by primary mirror 12 of Offner imaging system 10 and emerges from Offner imaging system 10 as second optical beam segment 22. The second reflection by the concave spherical surface 13 directs the second optical beam segment 22 towards the second folding mirror 182P'. FIG. 12 shows the optical path of this exemplary second optical beam 22, which is identical to the optical path of optical beam 21 in Offner system 10 as described above with respect to FIG. 1. The second optical beam segment 22 is reflected at the second folding mirror 182P' towards image plane 27 of the projection optical system 114 as a portion output optical beam 172.

The first optical beam segment 22 and the second optical beam segment 22 are reflected to form a continuous portion of output optical beam 172.

Referencing FIG. 13, the cross-sectional view of the first folding mirrors 181 shows that optical beam 170 will continuously intersect with the first folding mirrors 181 so that no portion of optical beam 170 propagates un-reflected between any of the first folding mirrors 182. The portion of optical beam 170 incident on first folding mirror 181S is continuous with the portion of optical beam 170 incident on first folding mirror 181P. Second folding mirrors 182 are likewise arranged to reflect all portions of the optical beam segments 22 propagating through Offner lens system 10 into a continuous output optical beam 172.

While the embodiments of the invention disclosed herein are presently considered to be preferred, various changes and modifications can be made without departing from the scope of the invention. The scope of the invention is indicated in the appended claims and all changes that come within the meaning and range of equivalents are intended to be embraced therein.

We claim:

1. A projection optical system for digital lithography, the system comprising:
    an Offner imaging system defining an optical axis and having a well-corrected region; and
    means for shaping an optical beam having an extent too large to fit within the well-corrected region to propagate through the Offner imaging system within the well-corrected region.

2. The projection optical system of claim 1, in which the means for shaping comprises means for reducing a dimension of the optical beam.

3. The projection optical system of claim 2, in which the means for reducing comprises a mirror system concentric with the optical axis, in which the mirror system directs the optical beam through the well-corrected region.

4. The projection optical system of claim 3, in which the mirror system comprises:
    a frustoconical internal reflective surface facing the optical axis, concentric with the optical axis, and further from the optical axis than the well-corrected region; and
    a frustoconical external reflective surface facing away from the optical axis and concentric with the optical axis, the frustoconical external reflective surface aligned to direct light reflected by the frustoconical internal reflective surface through the well-corrected region.

5. The projection optical system of claim 4, in which the mirror system further comprises a semi-frustoconical internal reflective surface aligned with the frustoconical internal reflective surface and operable to focus the output optical beam in an image plane of the projection optical system.

6. The projection optical system of claim 1, in which:
    the optical beam is a partially coherent; and
    the means for shaping comprises means for segmenting the optical beam into segments and for directing the segments into the well-corrected region.

7. The projection optical system of claim 6, in which the optical beam is non-coherent.

8. The projection optical system of claim 6, in which the means for segmenting comprises mirror segments aligned to direct the optical beam through the well-corrected region.

9. The projection optical system of claim 8, in which the mirror segments comprise:
    a turning mirror; and
    a pair of folding mirrors aligned with the turning mirror and the well-corrected region, in which the pair of folding mirrors is positioned in a plane perpendicular to the optical axis and offset along the optical axis from the well-corrected region.

10. The projection optical system of claim 8, in which:
    the mirror segments comprise:
    first folding mirrors aligned with the well-corrected region, and
    second folding mirrors each aligned with the well-corrected region and with a respective one of first folding mirrors; and
    the first folding mirrors and the second folding mirrors are located in a plane perpendicular to and circumferentially aligned about the optical axis and offset along the optical axis from the well-corrected region.

11. A method of imaging a spatial light modulator, the method comprising:
    providing an Offner imaging system defining an optical axis and having a well-corrected region;
    emitting an optical beam from the spatial light modulator, the optical beam having an extent too large to fit within the well-corrected region; and
    shaping the optical beam to propagate through the Offner imaging system within the well-corrected region.

12. The method of claim 11, in which the shaping comprises:
    reducing a dimension of the optical beam.

13. The method of claim ii, in which:
    the emitting comprises emitting the optical beam as a partially-coherent optical beam; and
    the shaping comprises segmenting the optical beam into segments, and
    directing the segments of the optical beam through the well-corrected region.

14. The method of claim 11, additionally comprising:
    directing the optical beam through the well-corrected region to provide an output optical beam; and
    imaging the output optical beam.

15. The method of claim 14, in which the imaging comprises focusing the output optical beam.

16. A projection optical system for digital lithography, the system comprising:
- an Offner imaging system defining an optical axis and having a well-corrected region; and
- a mirror system, concentric with the optical axis, operable to shape an optical beam having an extent too large to fit within the well-corrected region to propagate through the Offner imaging system within the well-corrected region.

17. The projection optical system of claim 16, in which the mirror system comprises:
- a frustoconical external reflective surface facing away from the optical axis, concentric with the optical axis and aligned to the well-corrected region; and
- a frustoconical internal reflector surface, facing the optical axis, concentric with the optical axis and further from the optical axis than the frustoconical external reflective surface, the frustoconical internal reflector surface operable to reduce a dimension of the optical beam and to direct the reduced-dimension optical beam towards the frustoconical external reflective surface.

18. The projection optical system of claim 16, in which the mirror system further comprises a semi-frustoconical internal reflector surface aligned to the frustoconical internal reflector surface and operable to focus the optical beam in an image plane.

19. The projection optical system of claim 16, in which:
the optical beam is partially coherent;
the mirror system comprises:
a turning mirror located to accept a segment of the optical beam, and
a pair of folding mirrors aligned with the turning mirror and the well-corrected region; and
the turning mirror and the pair of folding mirrors form an image of the segment at an image plane.

20. The projection optical system of claim 19, in which the optical beam is non-coherent.

21. The projection optical system of claim 16, in which:
the optical beam is partially coherent, and
the mirror system comprises:
first folding mirrors aligned with the well-corrected region, in which the first folding mirrors segment the optical beam into segments, and
second folding mirrors aligned with the well-corrected region and each aligned with a respective one of the first folding mirrors, in which the segments propagate through the Offner imaging system in the well-corrected region to form images of the segments in a reverse order at an image plane.

* * * * *

UNITED STATES PATENT AND TRADEMARK OFFICE
CERTIFICATE OF CORRECTION

PATENT NO. : 7,173,686 B2 Page 1 of 1
APPLICATION NO. : 10/933170
DATED : February 6, 2007
INVENTOR(S) : Russell Gruhlke It is certified that error appears in the above-identified patent and that said Letters Patent is hereby corrected as shown below:

Col. 12, line 54;
In Claim 12, delete "11,in" and
insert -- 11, in --, therefor.

Col. 12, line 57;
In Claim 13, delete "ii," and
insert -- 11, --, therefor.

Signed and Sealed this

Twenty-ninth Day of July, 2008

JON W. DUDAS
*Director of the United States Patent and Trademark Office*